(12) United States Patent
Nomura et al.

(10) Patent No.: US 7,927,941 B2
(45) Date of Patent: Apr. 19, 2011

(54) METHOD OF FABRICATING FIELD EFFECT TRANSISTORS WITH DIFFERENT GATE WIDTHS

(75) Inventors: Hiroshi Nomura, Kawasaki (JP);
Takashi Saiki, Kawasaki (JP);
Tsunehisa Sakoda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/817,508

(22) Filed: Jun. 17, 2010

(65) Prior Publication Data

US 2010/0255668 A1 Oct. 7, 2010

Related U.S. Application Data

(62) Division of application No. 11/236,509, filed on Sep. 28, 2005, now Pat. No. 7,768,039.

(30) Foreign Application Priority Data

Jun. 23, 2005 (JP) ................................. 2005-183920

(51) Int. Cl.
*H01L 21/336* (2006.01)
*H01L 27/148* (2006.01)

(52) U.S. Cl. ........ 438/197; 438/258; 257/219; 257/288; 257/368; 257/E21.599; 257/E21.615

(58) Field of Classification Search .................. None
See application file for complete search history.

(56) References Cited

U.S. PATENT DOCUMENTS

| 5,354,699 A | * | 10/1994 | Ikeda et al. | ................ | 438/234 |
|---|---|---|---|---|---|
| 5,512,497 A | * | 4/1996 | Ikeda et al. | ................ | 438/233 |
| 5,998,249 A | | 12/1999 | Liaw et al. | | |
| 6,362,056 B1 | | 3/2002 | Tonti et al. | | |
| 6,437,550 B2 | | 8/2002 | Andoh et al. | | |
| 6,573,529 B2 | | 6/2003 | Asano et al. | | |
| 6,660,597 B2 | | 12/2003 | Furukawa et al. | | |
| 6,767,780 B2 | * | 7/2004 | Sohn et al. | ................ | 438/217 |
| 6,898,111 B2 | | 5/2005 | Yamauchi | | |
| 6,909,133 B2 | | 6/2005 | Furukawa et al. | | |
| 7,015,554 B2 | | 3/2006 | Nakaoka et al. | | |
| 7,217,607 B2 | | 5/2007 | Furukawa et al. | | |

(Continued)

FOREIGN PATENT DOCUMENTS

CN 1388585 1/2003

(Continued)

OTHER PUBLICATIONS

Japanese Office Action, Partial English-language translation, mailed May 14, 2009 from JP Patent Office for corresponding Japanese Application No. 2005-183920.

(Continued)

*Primary Examiner* — Alonzo Chambliss
(74) *Attorney, Agent, or Firm* — Fujitsu Patent Center

(57) ABSTRACT

Four regions (a narrow NMOS region, a wide NMOS region, a wide PMOS region, and a narrow PMOS region) are defined on a semiconductor substrate. Then, after a gate insulating film and a polysilicon film are sequentially formed on the semiconductor substrate, n-type impurities are introduced into the polysilicon film in the wide NMOS region. Next, by patterning the polysilicon film, gate electrodes are formed in the four regions. Then, n-type impurities are introduced into the gate electrodes in the narrow NMOS region and the wide NMOS region. As a result, an impurity concentration of the gate electrode in the narrow NMOS region becomes lower than that of the gate electrode in the wide NMOS region.

9 Claims, 13 Drawing Sheets

U.S. PATENT DOCUMENTS

| | | | |
|---|---|---|---|
| 7,696,084 B2 * | 4/2010 | Saeki et al. | 438/622 |
| 7,768,039 B2 * | 8/2010 | Nomura et al. | 257/219 |
| 2001/0025997 A1 | 10/2001 | Onishi | |
| 2002/0179981 A1 | 12/2002 | Asano et al. | |
| 2003/0002328 A1 | 1/2003 | Lever | |
| 2003/0092233 A1 | 5/2003 | Furukawa et al. | |
| 2004/0106289 A1 | 6/2004 | Furukawa et al. | |
| 2004/0180489 A1 * | 9/2004 | Sohn et al. | 438/199 |
| 2004/0183141 A1 | 9/2004 | Nakaoka et al. | |
| 2005/0077548 A1 | 4/2005 | Furukawa et al. | |
| 2005/0174870 A1 | 8/2005 | Yamauchi | |
| 2006/0228860 A1 * | 10/2006 | Shinohara et al. | 438/257 |
| 2007/0187764 A1 | 8/2007 | Furukawa et al. | |

FOREIGN PATENT DOCUMENTS

| | | |
|---|---|---|
| CN | 1420548 | 5/2003 |
| CN | 1523675 | 8/2004 |
| GB | 2342777 | 4/2000 |
| JP | 2000-077538 | 3/2000 |
| JP | 2000-124325 | 4/2000 |
| JP | 2001-267431 | 9/2001 |
| JP | 2001-274262 | 10/2001 |
| JP | 2001-284464 | 10/2001 |
| JP | 2004-247636 | 9/2004 |
| JP | 2005-051264 | 2/2005 |

OTHER PUBLICATIONS

Chinese Office Action dated Feb. 22, 2008, issued in corresponding Chinese Application No. 200510114051.8.

Prior Art Information List

USPTO (Chambliss) Notice of Allowance Fees Due (PTOL-85); Examiner's Amendment mailed Mar. 19, 2010 for Parent U.S. Appl. No. 11/236,509 now Patent No. 7,768,039.

USPTO (Chambliss), Office Action, Non-Final Rejection, mailed Sep. 15, 2009 for Parent U.S. Appl. No. 11/236,509 now Patent No. 7,768,039.

USPTO (Chambliss), Office Action, Final Rejection, mailed Apr. 3, 2009 for Parent U.S. Appl. No. 11/236,509 now Patent No. 7,768,039.

USPTO (Chambliss), Office Action, Non-Final Rejection, mailed Jul. 18, 2008 for Parent U.S. Appl. No. 11/236,509 now Patent No. 7,768,039.

USPTO (Chambliss), Office Action, Requirement for Restriction/Election, mailed Feb. 11, 2008 for Parent U.S. Appl. No. 11/236,509 now Patent No. 7,768,039.

* cited by examiner

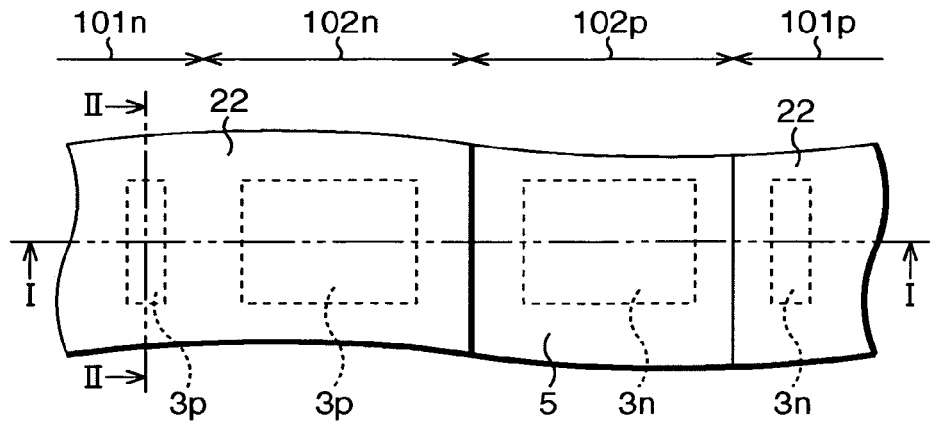
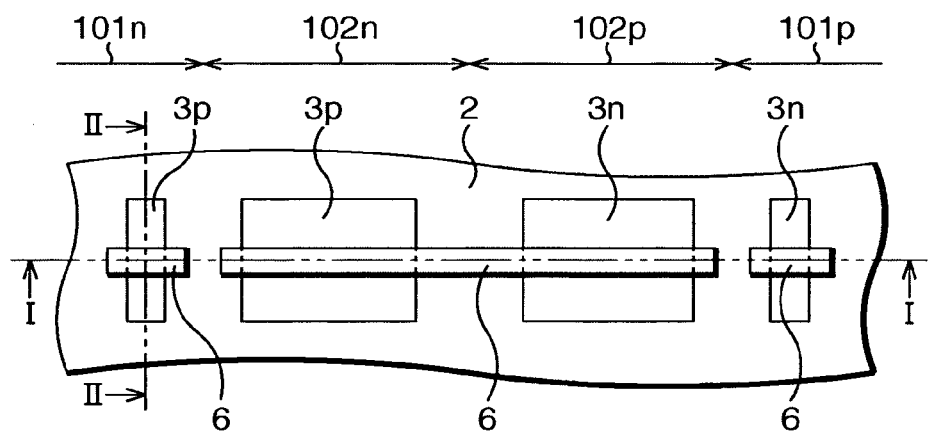
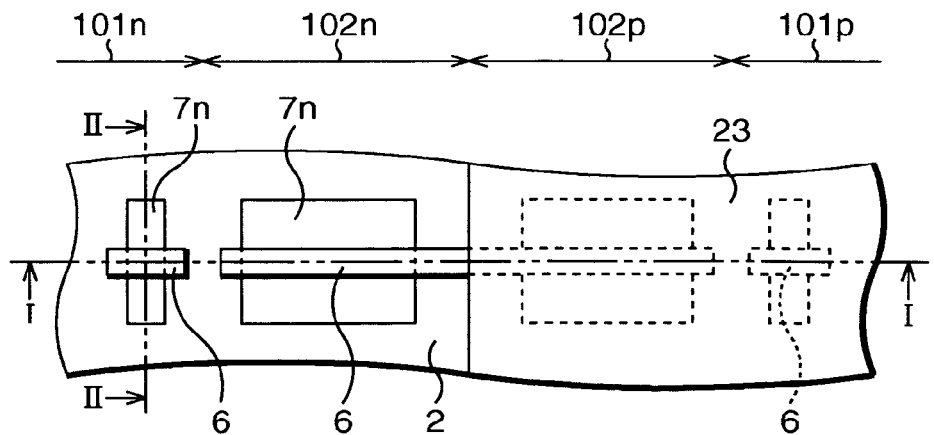

METHOD OF FABRICATING FIELD EFFECT TRANSISTORS WITH DIFFERENT GATE WIDTHS

CROSS-REFERENCE TO RELATED APPLICATIONS

This application is based upon and claims the benefit of priority from the prior Japanese Patent Application No. 2005-183920, filed on Jun. 23, 2005, the entire contents of which are incorporated herein by reference.

BACKGROUND OF THE INVENTION

1. Field of the Invention

The present invention relates to a semiconductor device having two kinds of transistors of different gate widths and a method for manufacturing the same.

2. Description of the Related Art

Currently, MOS transistors are used in many integrated circuits. As a material of a gate electrode of the MOS transistor, polysilicon is mainly used from the standpoint of process consistency etc. However, since silicon is a semiconductor, its resistance is large unless impurities are introduced. Because of this, the impurities are introduced into the polysilicon. But, if the amount of impurities introduced is small, it is not possible to sufficiently reduce its resistance. Further, when the amount of impurities is small, there exists a depletion layer at the boundary surface with a gate insulating film, which makes it impossible to attain a sufficient performance. Thereupon, with the transistor manufactured in recent years, the impurities are introduced into the polysilicon as much as possible.

As one of methods for introducing many impurities, a method is employed, in which after forming polysilicon film constituting the gate electrode, impurities are introduced and, further, after working the polysilicon film into a shape of the gate electrode, the second introduction of impurities is made. However, at the second introduction, there is a restriction to implantation energy and a dose amount from the standpoint of transistor characteristics because implantation into a source/drain diffusion layer of the transistor is also carried out simultaneously. On the other hand, there is no such restriction at the first introduction. Because of this, it is possible to obtain the desired transistor characteristics by controlling a concentration of the impurities of the gate electrode at the first introduction.

However, as the transistor is miniaturized, the situation starts to occur in which the desired characteristics, in particular, reliability in accordance with design is not obtained.

Related arts are disclosed in Japanese Patent Application Laid-open No. 2000-77538 (Patent Document 1), Japanese Patent Application Laid-open No. 2001-284464 (Patent document 2), and Japanese Patent Application Laid-open No. 2001-274262 (Patent document 3).

SUMMARY OF THE INVENTION

An object of the present invention is to provide a semiconductor device and a method for manufacturing the same that enables high reliability to be obtained while suppressing degradation in a performance so that the degradation is at a low level.

The results of an attentive research conducted by the inventors of the present invention in order to find the causes of the above-mentioned troubles are explained below. The inventors of the present invention focused their mind on the characteristics of the gate insulating film in association with the degradation of reliability. Then, a time dependant dielectric breakdown (TDDB) test was conducted as to two kinds of MOS transistors of different gate widths. In this test, two kinds of gate electrodes doped with the impurities before working were formed on a gate oxide film having a thickness of 1.2 nm. At this time, one gate width $W_0$ was set to 5.0 μm and the other gate width $W_1$ to 0.24 μm. Then, a voltage of 2.3 V was applied between the gate and the source/drain and a change in a failure rate with a lapse of time was investigated. The results are shown in FIG. 1. FIG. 1 is a graph showing a trend of the results of the TDDB test as to the two kinds of specimens of different gate widths.

As shown in FIG. 1, the failure rate began to rise earlier in the specimen having a gate width $W_1$ of 0.24 μm than in the specimen having a gate width $W_0$ of 5 μm. This means that, with the specimen having a gate width $W_0$ of 5 μm, a C mode (intrinsic breakdown) failure has occurred in the gate oxide film, whereas, with the specimen having a gate width $W_1$ of 0.24 μm, a B mode failure has occurred in the gate oxide film. According to such results of the TDDB test, the inventors of the present invention have found that the fact that the gate width becomes narrower as the miniaturization advances is one of the causes of the degradation of reliability. By the way, the TDDB test was conducted so far but such a trend was not published. It is thought that the reason is that the trend as mentioned above, which would occur as the gate width is reduced, has not occurred because the specimen having a wide gate width was used in the general TDDB test.

Then, the inventors of the present invention have further conducted an intensive research in order to ensure high reliability even when the gate width is narrow. Their mind was focused on the relationship between the amount of the impurities introduced and the reliability of the gate oxide film to conduct another TDDB test as to two kinds of MOS transistors. In this test, on the gate oxide film having a thickness of 1.2 nm was formed the gate electrode having the same dimension (gate width: 0.24 μm). For one of the MOS transistors, introduction of the impurities into the gate electrode before working was carried out, and for the other one, introduction of the impurities into the gate electrode before working was not carried out. Then, a voltage of 2.3 V was applied between the gate and the source/drain and a change in the failure rate with a lapse of time was investigated. The results are shown in FIG. 2. FIG. 2 is a graph showing a trend of the results of the TDDB test as to the two kinds of specimens of which the impurity concentration is different.

As shown in FIG. 2, in the MOS transistor having an extremely narrow gate width of 0.24 μm, when doped before working, the B mode failure occurred. In contrast to this, when not doped before working, no B mode failure occurred. This means that particularly in the transistor having a narrow gate width, the reliability of the gate oxide film has been degraded as a large amount of impurities have been introduced in recent years.

Then, the inventors of the present invention have thought out the following aspects of the present invention, based on the test results etc.

The semiconductor device according to the present invention includes a first field effect transistor having a first gate electrode composed of polysilicon into which impurities have been introduced, and a second field effect transistor having a second gate electrode composed of polysilicon into which impurities have been introduced. The gate width of the second field effect transistor is narrower than that of the first field effect transistor. A conduction type of the second field effect transistor coincides with that of the first field effect transistor.

Further, the impurity concentration of the second gate electrode is lower than that of the first gate electrode.

In the method for manufacturing a semiconductor device according to the present invention, a semiconductor device having a first field effect transistor and a second field effect transistor is manufactured. It should be noted that the gate width of the second field effect transistor is narrower than that of the first field effect transistor, and that the conduction type of the second field effect transistor coincides with that of the first field effect transistor. After a gate insulating film and a polysilicon film are sequentially formed on a semiconductor substrate, first impurities are introduced into a part of the polysilicon film. Next, by patterning the polysilicon film, a first gate electrode into which the first impurities have been introduced is formed for the first field effect transistor, and a second gate electrode into which the first impurities have not been introduced is formed for the second field effect transistor. Then, second impurities are introduced into the first and second gate electrodes.

BRIEF DESCRIPTION OF THE DRAWINGS

FIG. 3A to FIG. 3J are top plan views each showing a method for manufacturing a semiconductor device according to an embodiment of the present invention.

DETAILED DESCRIPTION OF THE PREFERRED EMBODIMENTS

An embodiment of the present invention is concretely explained below with reference to the accompanying drawings. It should be noted that a structure of the semiconductor device is explained here along with the method for manufacturing the same for convenience. FIG. 3A to FIG. 3J are top plan views showing the method for manufacturing a semiconductor device according to the embodiment of the present invention in order of processes. FIG. 4A to FIG. 4J are cross section views showing cross sections along the I-I lines in FIG. 3A to FIG. 3J, and FIG. 5A to FIG. 5J are cross section views showing cross sections along the II-II lines in FIG. 3A to FIG. 3J.

Figure 1:
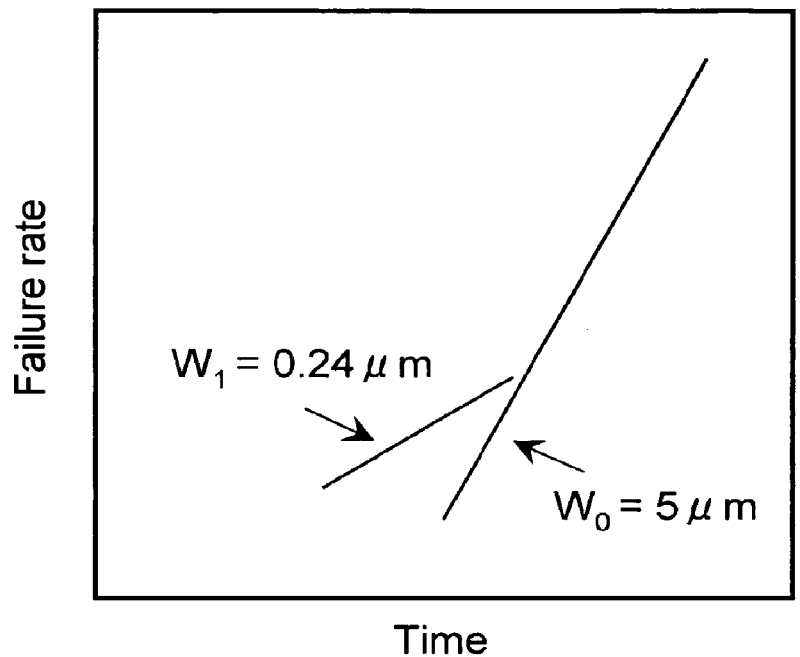
FIG. 1 is a graph showing a trend of the results of the TDDB test as to two kinds of specimens of different gate widths.
Figure 2:
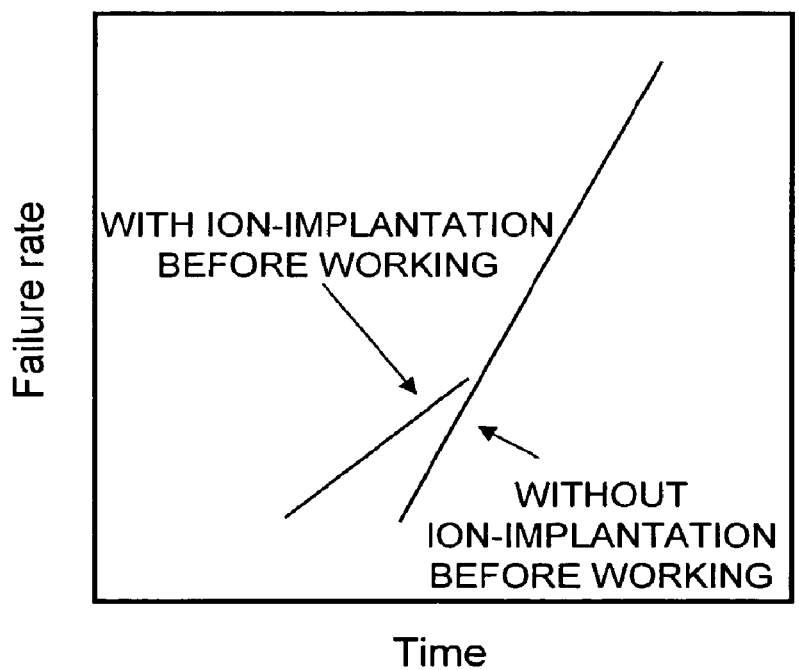
FIG. 2 is a graph showing a trend of the results of the TDDB test as to two kinds of specimens of different impurity concentrations.
Figure 3A:
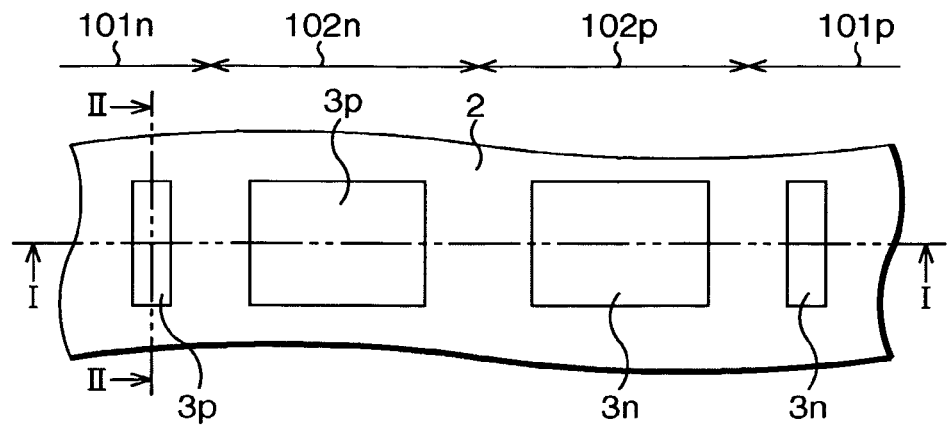
Figure 4A:
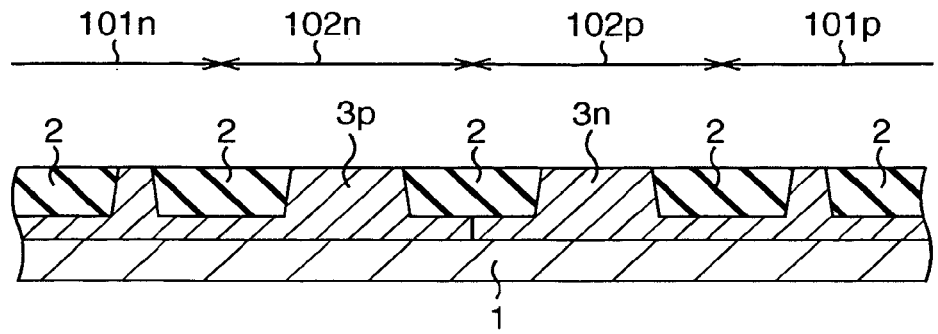
FIG. 4A to FIG. 4J are cross section views showing cross sections along the I-I lines in FIG. 3A to FIG. 3J.
Figure 5A:
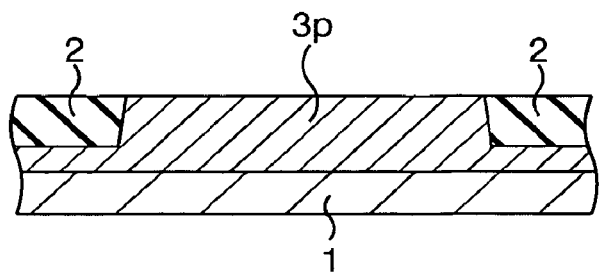
FIG. 5A to FIG. 5J are cross section views showing cross sections along the II-II lines in FIG. 3A to FIG. 3J.

In this embodiment, as shown in FIG. 3A, FIG. 4A, and FIG. 5A, four regions (a narrow NMOS region 101n, a wide NMOS region 102n, a wide PMOS region 102p, and a narrow PMOS region 101p) are defined on a semiconductor substrate (for example, a silicon substrate) 1. The narrow NMOS region 101n is a region in which, for example, an n-channel MOS transistor having a gate width of 0.25 μm is formed. The wide NMOS region 102n is a region in which, for example, an n-channel MOS transistor having a gate width of 1.0 μm is formed. The wide PMOS region 102p is a region in which, for example, a p-channel MOS transistor having a gate width of 1.0 μm is formed. The narrow PMOS region 101p is a region in which, for example, a p-channel MOS transistor having a gate width of 0.25 μm is formed.

Then, as shown in FIG. 3A, FIG. 4A, and FIG. 5A, an element isolating insulating film 2 is formed on the surface of the semiconductor substrate 1 with a shallow trench isolation (STI) method. The depth of the element isolating insulating film 2 is set to, for example, about 300 nm. Next, p-wells 3p are formed in the narrow NMOS region 101n and the wide NMOS region 102n respectively, and n-wells 3n are formed in the narrow PMOS region 101p and the wide PMOS region 102p respectively.

Figure 3B:
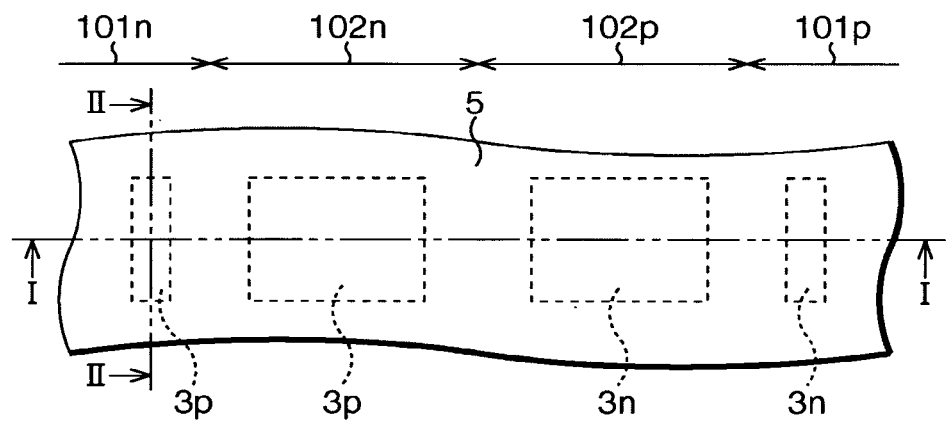
Figure 4B:
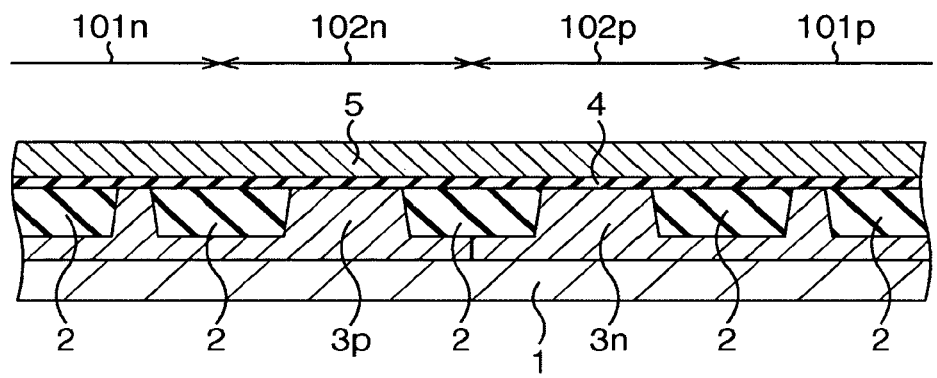
Figure 5B:
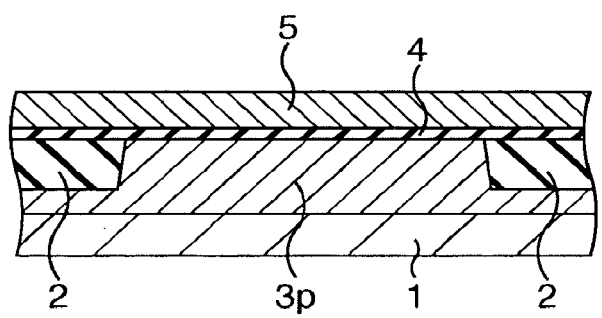

Then, as shown in FIG. 4B and FIG. 5B, a gate insulating film 4 is formed by thermally oxidizing the surface of the semiconductor substrate 1. The thickness of the gate insulating film 4 is set to, for example, 1.2 nm. After that, as shown in FIG. 3B, FIG. 4B, and FIG. 5B, a polysilicon film 5 is formed on the entire surface. The thickness of the polysilicon film 5 is set to, for example, 100 nm.

Figure 3C:
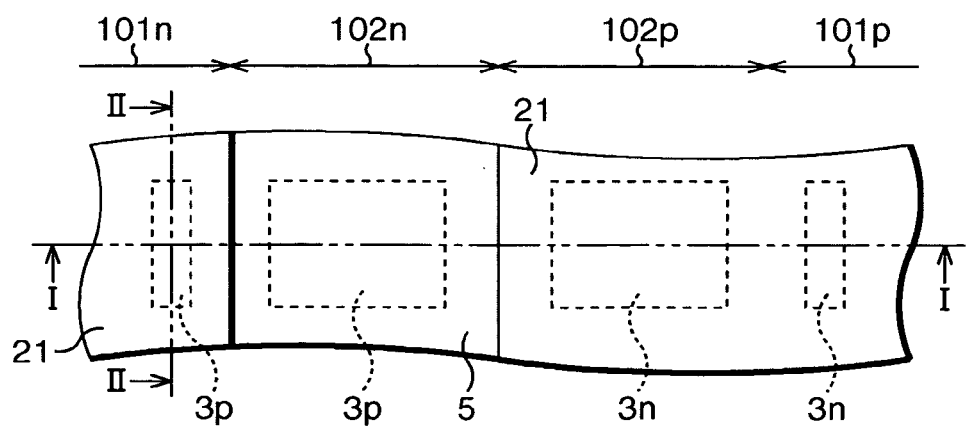
Figure 4C:
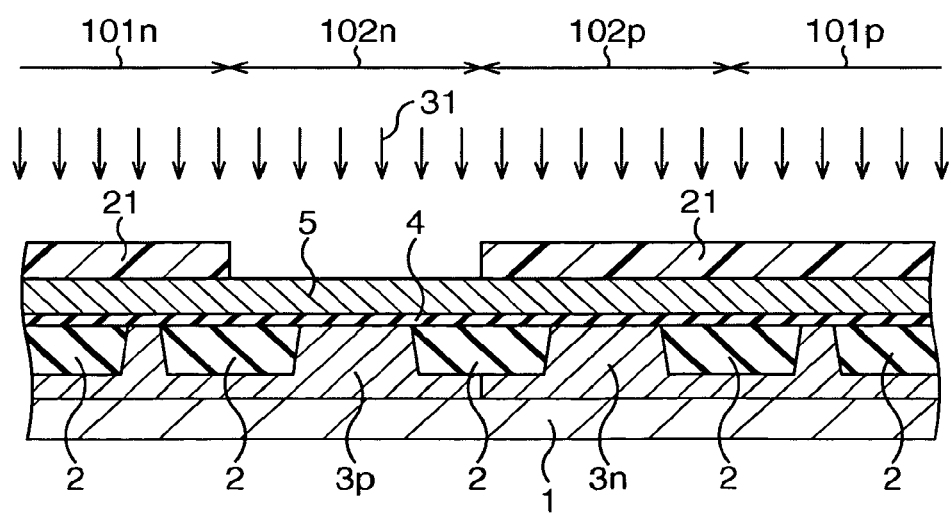
Figure 5C:
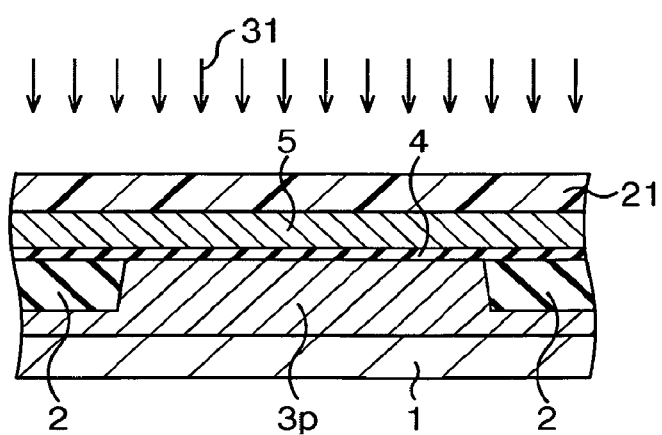

Next, as shown in FIG. 3C, FIG. 4C, and FIG. 5C, a resist mask 21 is formed. The resist mask 21 covers the narrow NMOS region 101n, the wide PMOS region 102p, and the narrow PMOS region 101p and exposes the wide NMOS region 102n. Then, ion implantation of n-type impurities (for example, phosphorus (P)) 31 into the polysilicon film 5 is carried out. For example, the implantation energy at this time is set to 8 keV and the dose amount is set to $5 \times 10^{15}$ cm$^{-2}$. Next, the resist mask 21 is removed.

Figure 4D:
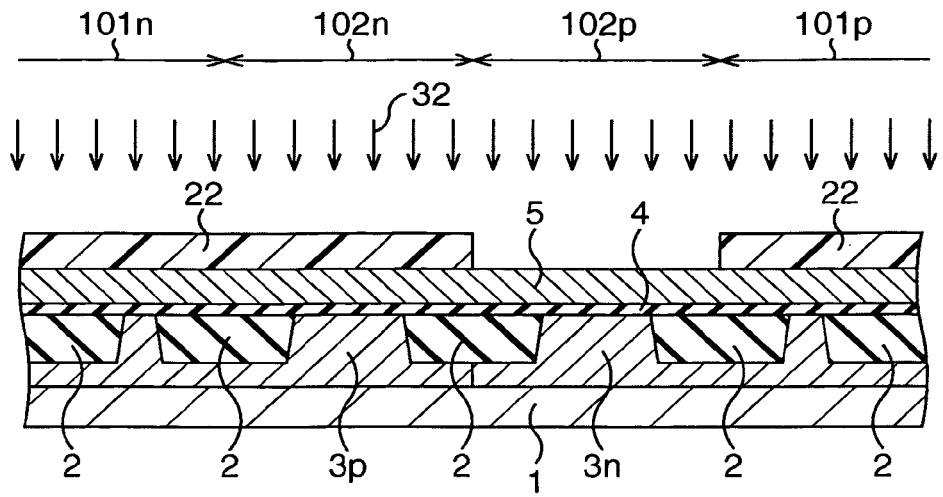
Figure 5D:
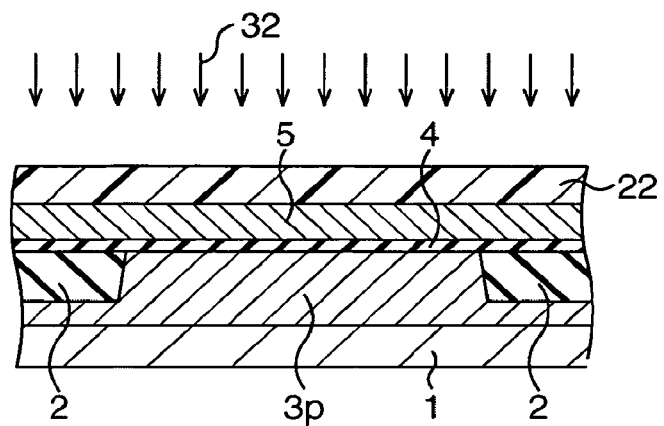

Next, as shown in FIG. 3D, FIG. 4D, and FIG. 5D, a resist mask 22 is formed. The resist mask 22 covers the narrow NMOS region 101n, the wide NMOS region 102n, and the narrow PMOS region 101p and exposes the wide PMOS region 102p. Then, the ion implantation of p-type impurities (for example, boron (B)) 32 into the polysilicon film 5 is carried out. After this, the resist mask 22 is removed.

Figure 4E:
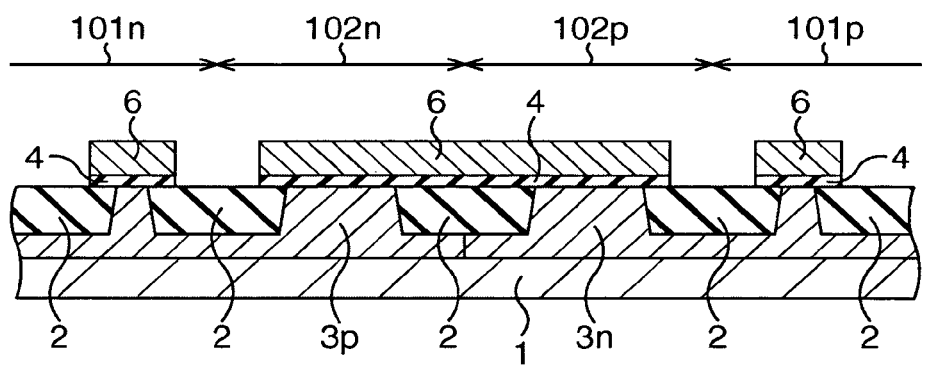
Figure 5E:
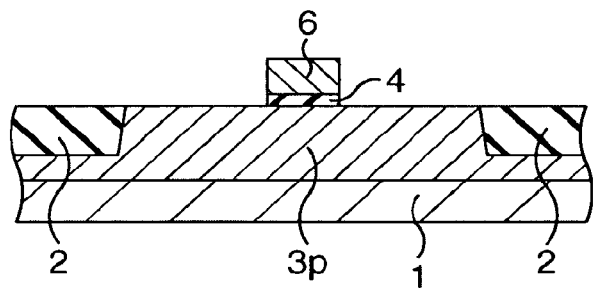

Then, as shown in FIG. 3E, FIG. 4E, and FIG. 5E, a gate electrode 6 is formed by working the polysilicon film 5.

Figure 4F:
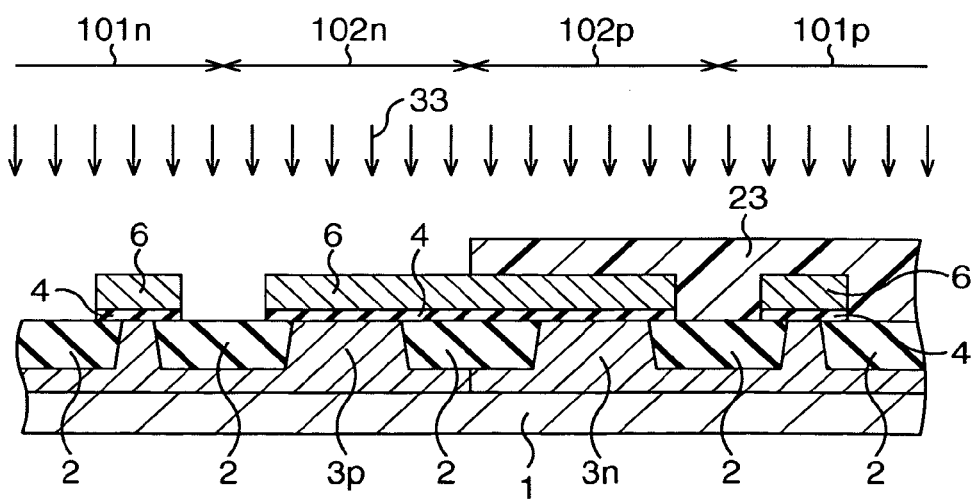
Figure 5F:
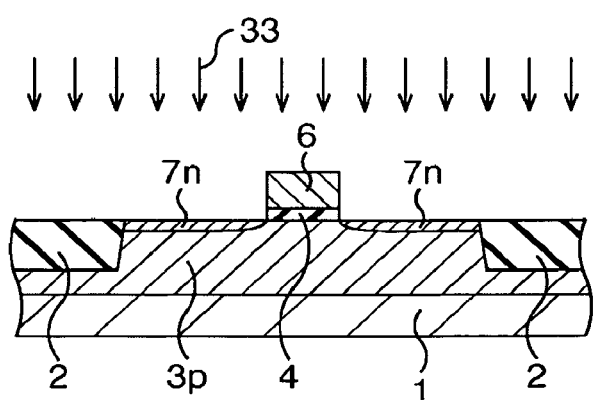

Next, as shown in FIG. 3F, FIG. 4F, and FIG. 5F, a resist mask 23 is formed. The resist mask 23 covers the wide PMOS region 102p and the narrow PMOS region 101p and exposes the narrow NMOS region 101n and the wide NMOS region 102n. Then, ion implantation of n-type impurities (for example, phosphorus (P)) 33 is carried out. As a result, in the narrow NMOS region 101n and the wide NMOS region 102n, n-type extension layers 7n are formed simultaneously with a rise in the impurity concentration within the gate electrodes 6. Next, the resist mask 23 is removed.

Figure 3G:
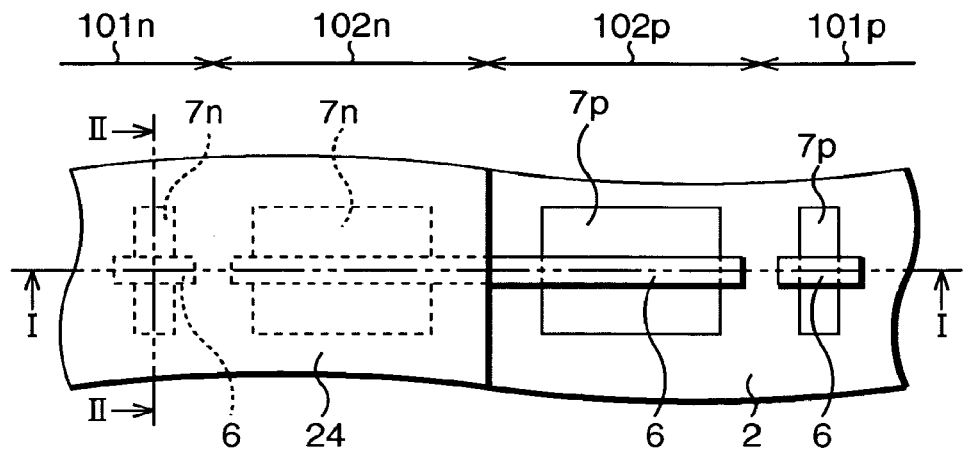
Figure 4G:
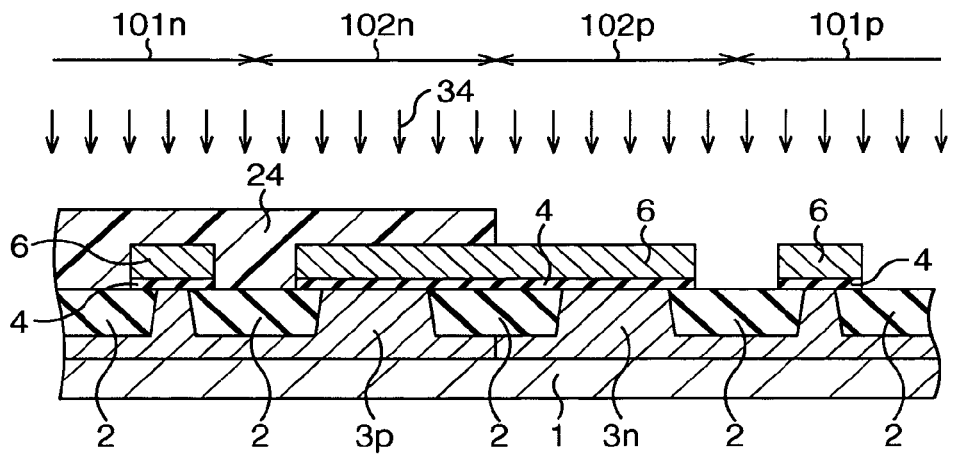
Figure 5G:
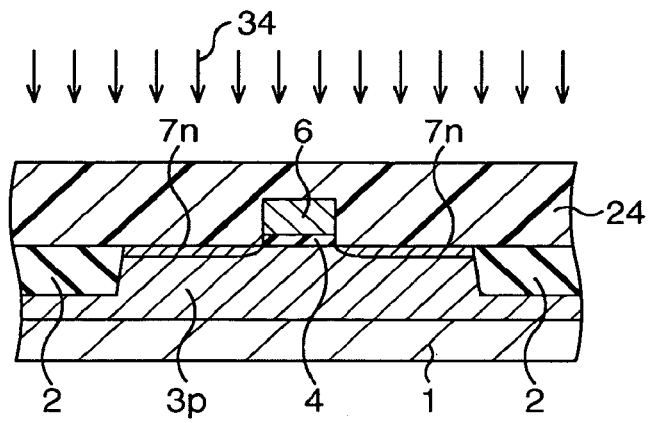

After that, as shown in FIG. 3G, FIG. 4G, and FIG. 5G, a resist mask 24 is formed. The resist mask 24 covers the narrow NMOS region 101n and the wide NMOS region 102n and exposes the wide PMOS region 102p and the narrow PMOS region 101p. Then, ion implantation of p-type impurities (for example, boron (B)) 34 is carried out. As a result, in the narrow PMOS region 101p and the wide PMOS region 102p, p-type extension layers 7p are formed simultaneously with a rise in the impurity concentration within the gate electrodes 6. Continuously, the resist mask 24 is removed.

Figure 3H:
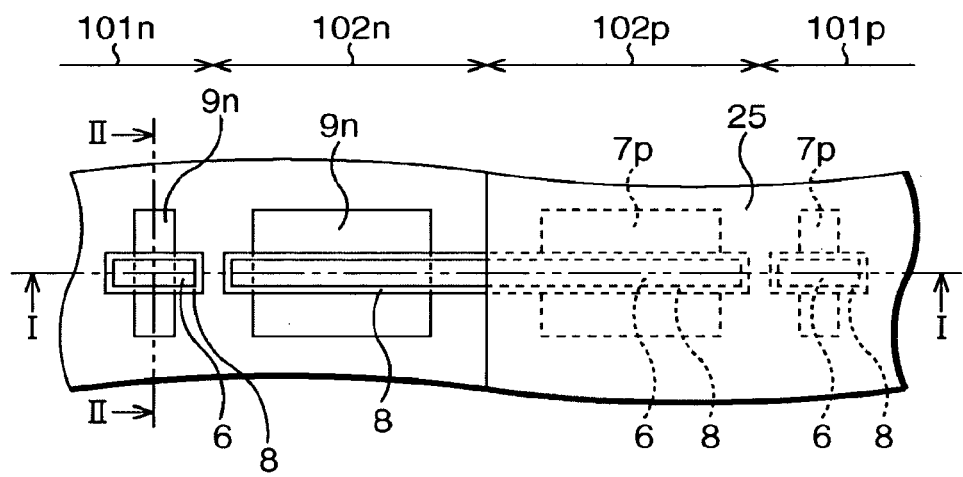
Figure 4H:
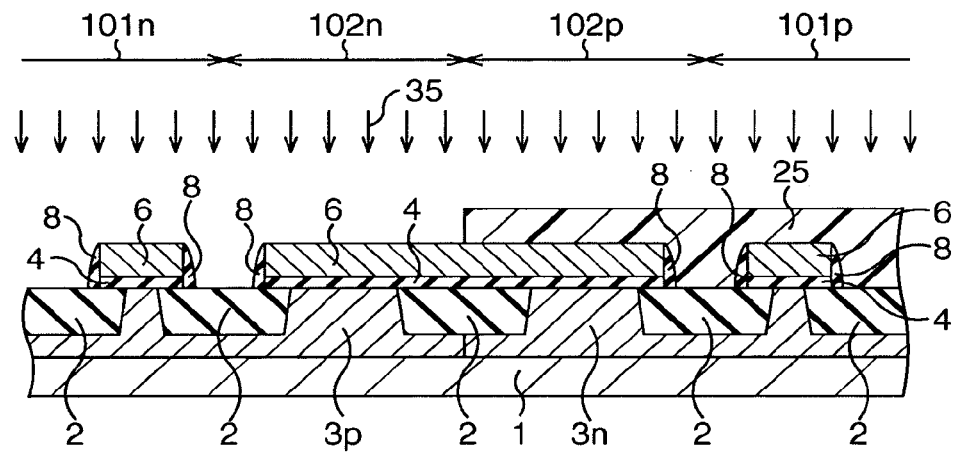
Figure 5H:
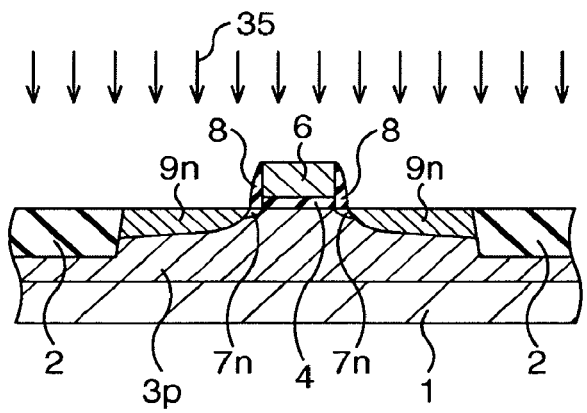

Next, as shown in FIG. 3H, FIG. 4H, and FIG. 5H, a sidewall 8 is formed on the side of each gate electrode 6. The sidewall 8 can be formed, for example, by, after forming a silicon oxide film on the entire surface, back-etching it. Then, a resist mask 25 is formed. The resist mask 25 covers the wide PMOS region 102p and the narrow PMOS region 101p and exposes the narrow NMOS region 101n and the wide NMOS region 102n. Then, ion implantation of n-type impurities (for example, phosphorus (P)) 35 is carried out. In the ion implantation, a larger amount of ions is implanted than when the n-type extension layers 7n are formed. As a result, in the narrow NMOS region 101n and the wide NMOS region 102n, n-type source/drain diffusion layers 9n are formed simultaneously with a rise in the impurity concentration within the gate electrodes 6. Next, the resist mask 25 is removed.

Figure 3I:
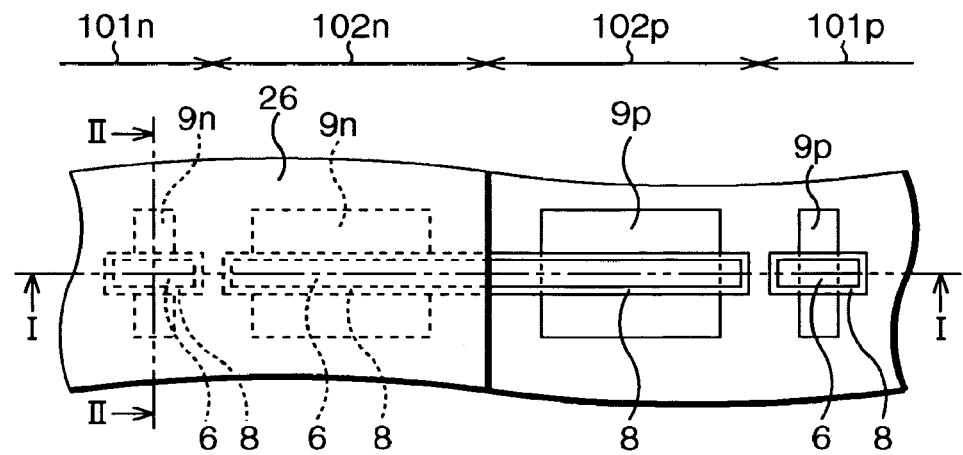
Figure 4I:
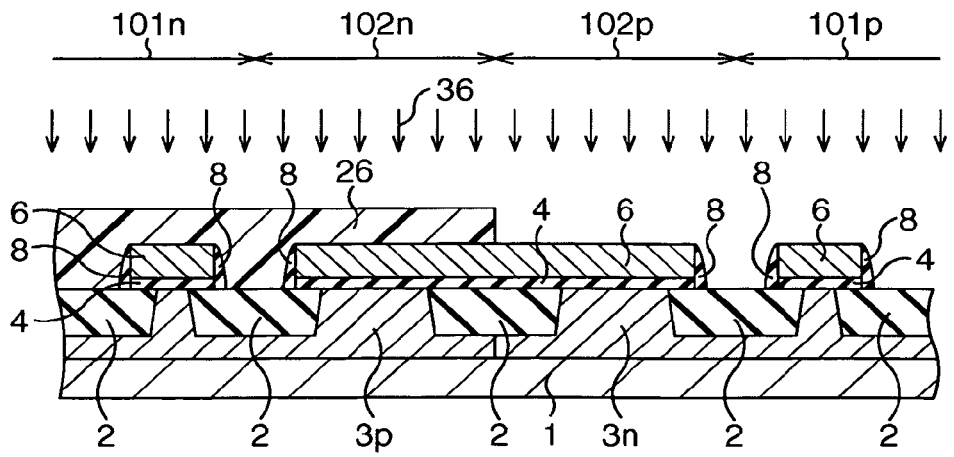
Figure 5I:
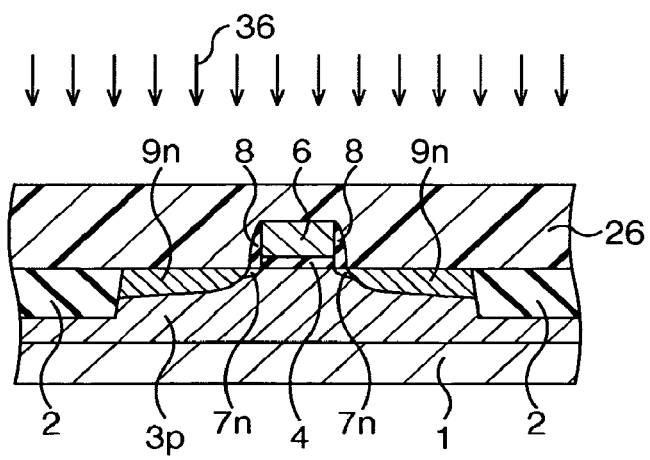

Next, as shown in FIG. 3I, FIG. 4I, and FIG. 5I, a resist mask 26 is formed. The resist mask 26 covers the narrow NMOS region 101n and the wide NMOS region 102n and exposes the wide PMOS region 102p and the narrow PMOS region 101p. Then, ion implantation of p-type impurities (for example, boron (B)) 36 is carried out. In this ion implantation, a larger amount of ions is implanted than when the p-type extension layers 7p are formed. As a result, in the narrow PMOS region 101p and the wide PMOS region 102p, p-type source/drain diffusion layers 9p are formed simultaneously with a rise in the impurity concentration within the gate electrodes 6. Next, the resist mask 26 is removed.

Figure 3J:
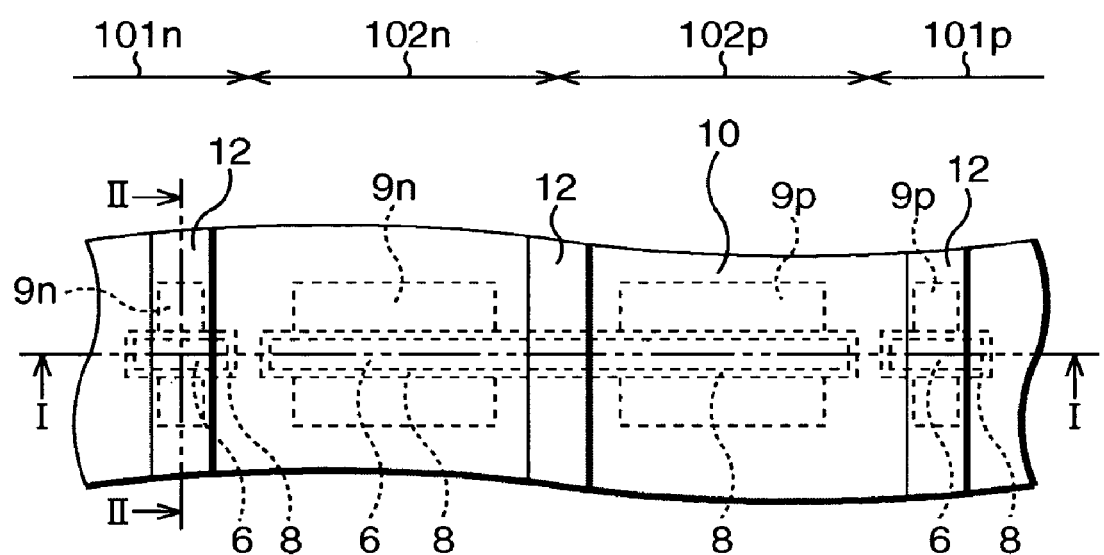
Figure 4J:
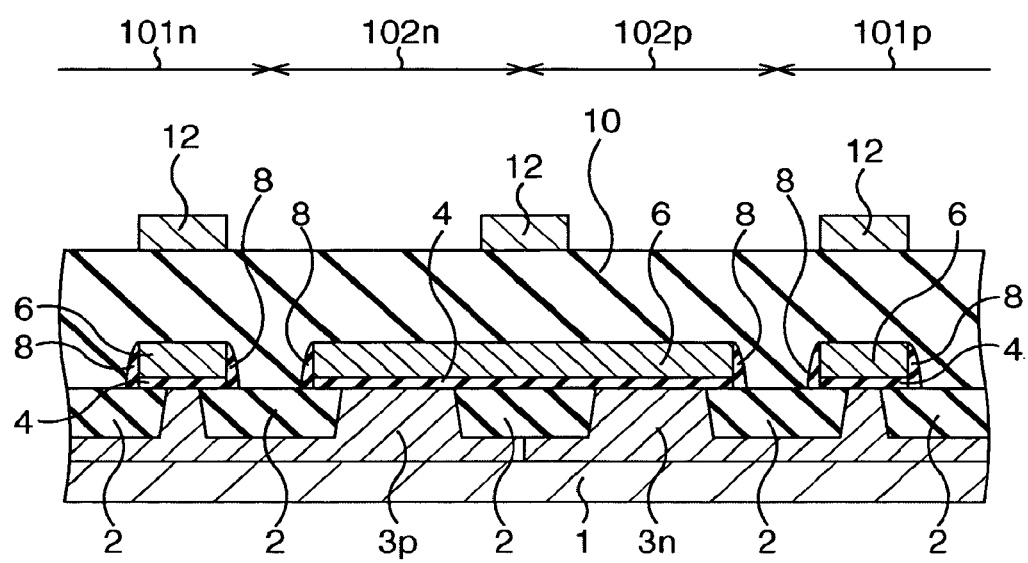
Figure 5J:
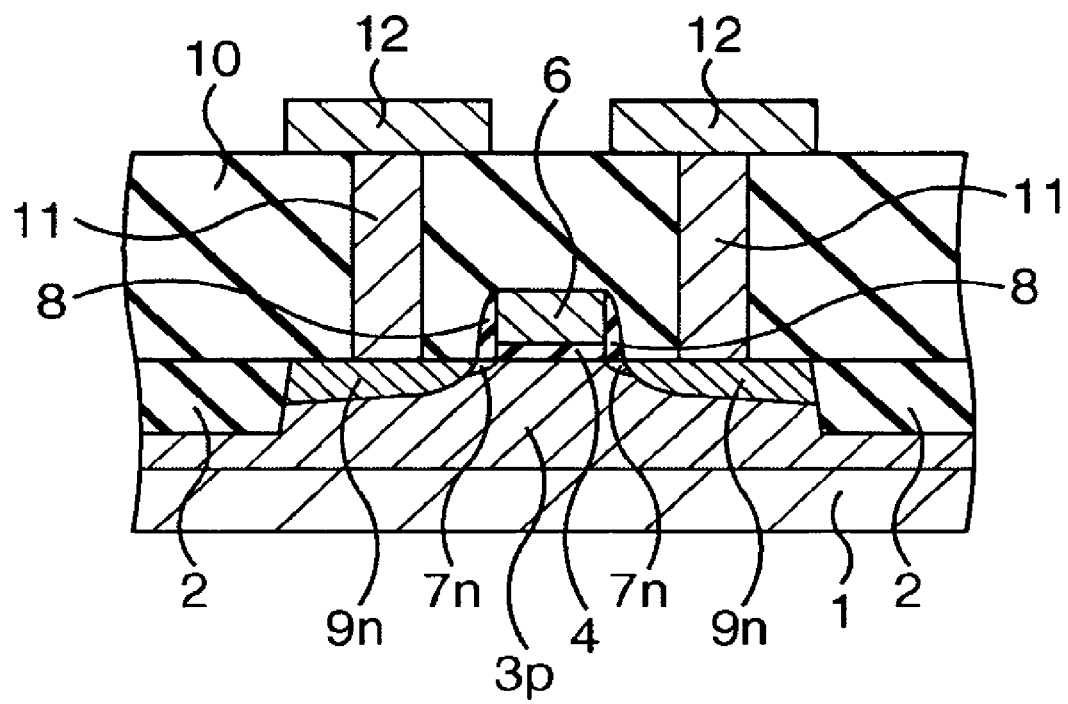

Next, as shown in FIG. 3J, FIG. 4J, and FIG. 5J, an interlayer insulating film 10 is formed on the entire surface. Then, contact holes are formed in the interlayer insulating film 10, into which contact plugs 11 are embedded. After that, wiring 12 to be connected to the contact plugs 11 are formed on the interlayer insulating film 10. Then, multilayer wirings, a cover film (not shown) and so on are formed and thus the semiconductor device is completed.

It should be noted that, in FIG. 1A to FIG. 1J and in FIG. 2A to FIG. 2J, the four regions 101n, 102n, 102p, and 101p are arranged on a straight line, but this is just for convenience and the arrangement is not limited to this. In the narrow PMOS region 101p and the narrow NMOS region 101n, for example, transistors constituting a memory cell such as a RAM or a ROM are arranged, and in the wide PMOS region 102p and the wide NMOS region 102n, for example, transistors constituting a control circuit, a drive circuit such as a RAM and a ROM, or the like required to operate at a high speed are arranged.

According to the embodiment, as is in the test the inventors of the present invention conducted, it is possible to prevent the B mode failure from occurring also in the MOS transistor in the narrow NMOS region 101n and the narrow PMOS region 101p. Due to this, it is possible to suppress the degradation of reliability accompanying the B mode failure.

In the MOS transistor in the narrow NMOS region 101n and the narrow PMOS region 101p, a drive performance is a little degraded because the impurity concentration of the gate electrodes becomes lower compared to the conventional one. However, an influence of the degradation on the entire characteristics of the semiconductor device is small. This is because the MOS transistors in the narrow NMOS region 101n and the narrow PMOS region 101p are not required to have a high drive performance and the gate electrodes of the MOS transistors in the wide NMOS region 102n and the wide PMOS region 102p, which are required to have a high drive performance, are doped with a sufficient amount of the impurities.

In the above-mentioned embodiment, in the narrow NMOS region 101n and the narrow PMOS region 101p, no ion implantation into the polysilicon film 5 before working is carried out at all, but if it is finally possible to attain a proper impurity concentration in the gate electrodes 6, the ion implantation into the polysilicon film 5 before working may be carried out. Carrying out such ion implantation leads to a rise in the number of processes and the cost, but a finer adjustment of the characteristics becomes possible. In this case, the impurity concentration of the gate electrodes in the narrow NMOS region 101n and the narrow PMOS region 101p are preferably set to 60% to 70% or so of the impurity concentration of the gate electrodes in the wide NMOS region 102n and the wide PMOS region 102p, respectively. When the ratio is less than 60%, it becomes difficult to maintain sufficient characteristics in the narrow NMOS region 101n and the narrow PMOS region 101p. On the other hand, if the ratio exceeds 70%, it becomes difficult to maintain high reliability.

Further, the gate width and the thickness of the gate insulating film are not limited. However, particularly outstanding effects can be obtained when the gate widths of the wide NMOS region 102n and the wide PMOS region 102p are equal to or greater than 0.5 μm, when the gate widths of the narrow NMOS region 101n and the narrow PMOS region 101p are equal to or less than 0.5 μm, and/or when the thickness of the gate insulating film is 0.8 nm to 1.5 nm.

Patent document 1 discloses a proposal that a gate electrode of a p-channel MOS transistor constituting a CMOS transistor is composed of non-doped silicon. However, if the non-doped silicon is used, a depletion layer results in being generated together with a rise in the resistance. Further, there is no description on a gate width in Patent document 1.

Patent document 2 discloses a proposal that the impurity concentrations of gate electrodes are made different between two transistors having the same channel length and channel width. However, there is no description on transistors of different channel widths (corresponding to gate widths).

Patent document 3 discloses a proposal that impurity concentrations of gate electrodes are made different between two transistors having different operation voltages. However, there is no description on a relationship between a gate width and the operation voltage.

Therefore, it is not possible to easily think out the present invention from the techniques described in Patent documents 1 to 3.

According to the present invention, making the impurity concentration of the second gate electrode lower than that of the first gate electrode suppresses occurrence of the B mode failure, thereby allowing high reliability to be obtained.

We claim:

1. A method for manufacturing a semiconductor device comprising a first field effect transistor and a second field effect transistor, a gate width of said second field effect transistor being narrower than that of said first field effect transistor and a conduction type of said second field effect transistor coinciding with that of said first field effect transistor, said method comprising the steps of: forming a gate insulating film and a polysilicon film sequentially on a semiconductor substrate; introducing first impurities into a part of said polysilicon film; patterning said polysilicon film, thereby forming a first gate electrode into which said first impurities have been introduced for said first field effect transistor, and forming a second gate electrode into which said first impurities have not been introduced for said second field effect transistor; and introducing second impurities into said first and second gate electrodes.

2. The method for manufacturing a semiconductor device according to claim 1, wherein a thickness of said gate insulating film is between 0.8 nm and 1.5 nm.

3. The method for manufacturing a semiconductor device according to claim 1, wherein a gate width of said first field effect transistor is equal to or greater than 0.5 μm.

4. The method for manufacturing a semiconductor device according to claim 1, wherein a gate width of said second field effect transistor is equal to or less than 0.5 μm.

5. The method for manufacturing a semiconductor device according to claim 1, wherein said first and second impurities are phosphorus.

6. The method for manufacturing a semiconductor device according to claim 1, wherein an impurity concentration in said second gate electrode is 60% to 70% of an impurity concentration in said first gate electrode.

7. The method for manufacturing a semiconductor device according to claim 1, wherein said step of introducing said first impurities comprises the step of carrying out ion implantation into said part of said polysilicon film.

8. The method for manufacturing a semiconductor device according to claim 1, wherein said step of introducing said second impurities comprises the step of carrying out ion implantation into said first and second gate electrodes.

9. The method for manufacturing a semiconductor device according to claim 1, comprising the step of forming a memory cell including said second field effect transistor.

* * * * *